United States Patent
Capodieci

(10) Patent No.: US 7,263,683 B1
(45) Date of Patent: Aug. 28, 2007

(54) SIMPLIFIED OPTICAL PROXIMITY CORRECTION BASED ON 1-DIMENSION VERSUS 2-DIMENSION PATTERN SHAPE CLASSIFICATION

(75) Inventor: Luigi Capodieci, Santa Cruz, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 243 days.

(21) Appl. No.: 10/935,334

(22) Filed: Sep. 7, 2004

(51) Int. Cl.
*G06F 17/50* (2006.01)

(52) U.S. Cl. .......................... 716/21; 716/19
(58) Field of Classification Search ............ 716/21, 716/19
See application file for complete search history.

(56) References Cited

U.S. PATENT DOCUMENTS

| | | | |
|---|---|---|---|
| 6,243,855 B1 * | 6/2001 | Kobayashi et al. ............ 716/19 |
| 6,269,472 B1 | 7/2001 | Garza et al. | |
| 6,301,697 B1 | 10/2001 | Cobb | |
| 6,316,152 B1 | 11/2001 | Hsieh et al. | |
| 6,425,117 B1 | 7/2002 | Pasch et al. | |
| 6,453,457 B1 | 9/2002 | Pierrat et al. | |
| 6,499,003 B2 | 12/2002 | Jones et al. | |
| 6,817,003 B2 | 11/2004 | Lippincott et al. | |
| 6,853,743 B2 * | 2/2005 | Kotani et al. ............... 382/144 |
| 2002/0073388 A1 * | 6/2002 | Orshansky et al. ............ 716/5 |
| 2003/0115569 A1 * | 6/2003 | Ikeuchi ........................ 716/19 |
| 2004/0060034 A1 * | 3/2004 | Cote et al. .................... 716/21 |

OTHER PUBLICATIONS

Nicolas Bailey Cobb, Fast Optical and Process Proximity Correction Algorithms for Integrated Circuit Manufacturing. Spring, 1998.

* cited by examiner

*Primary Examiner*—Sun James Lin
(74) *Attorney, Agent, or Firm*—Amin, Turocy & Calvin, LLP

(57) ABSTRACT

A system that facilitates optical proximity correction comprises a layout that is desirably transferred to a silicon wafer, and an optical proximity correction component that alters the layout based at least in part upon a distinction between one-dimensional patterns and two-dimensional patterns within the layout. The system can comprise a block generator that replaces two-dimensional patterns within the layout with blocks. A model-based optical proximity correction component thereafter performs model-based optical proximity correction upon one-dimensional patterns within the layout.

24 Claims, 10 Drawing Sheets

SIMPLIFIED OPTICAL PROXIMITY CORRECTION BASED ON 1-DIMENSION VERSUS 2-DIMENSION PATTERN SHAPE CLASSIFICATION

TECHNICAL FIELD

The present invention relates generally to optical proximity correction, and more particularly to simplifying optical proximity correction via classifying portions of a design as one-dimensional or two-dimensional.

BACKGROUND OF THE INVENTION

Integrated circuits have permeated into every aspect of modern society. They are the building blocks used to create everything from the information super-highway to the electronic timer in the family toaster. Generally, any device that is used today that is considered "electronic" utilizes one or more integrated circuits. These often-unseen entities help to reduce the daily workload, increase the safety of our air traffic control systems, and even let us know when it is time to add softener to the washing machine. Modern society has come to rely on these devices in almost every product produced today. And, as we progress further into a technologically dependent society, the demand for increased device speeds, capacity and functionality drive integrated manufacturers to push the edge of technology even further.

In the integrated circuit industry, there is a continuing trend toward higher device densities. To achieve these high device densities there have been, and continue to be, efforts toward scaling down device dimensions (e.g., at sub-micron levels) on semiconductor wafers. In order to accomplish such densities, smaller feature sizes and more precise feature shapes are required. This may include width and spacing of interconnecting lines, spacing and diameter of contact holes, and surface geometry, such as corners and edges, of various features. The dimensions of and between such small features can be referred to as critical dimensions (CDs). Reducing CDs and reproducing more accurate CDs facilitates achieving higher device densities.

Currently, optical microlithography is a technology employed to pattern integrated circuit designs onto a silicon wafer. Success of microlithography can be attributed to ease of transferring layout patterns to silicon by optical projection printing, high yield, and high throughput. As CDs continue to shrink, however, image quality related to microlithography can erode, as design patterns are shrinking at a faster rate than technology related to smaller light wavelengths is advancing. Optical proximity correction (OPC) is one particular system/methodology that can be employed to increase resolution of a microlithography process and/or compensate for known pattern non-idealities.

Specifically, OPC is a mask-engineering technique that is employed to facilitate patterning on a silicon wafer in manner that matches a design for that pattern. OPC is employed to compensate mask geometry for known effects that occur during imaging or subsequent processing. Typically, an integrated circuit design is generated that is desirably patterned onto a wafer. The design is placed onto a mask (reticle), and thereafter patterned onto silicon. The design patterned on the mask, however, often does not translate well to the wafer, especially in light of continued decreases in CDs.

OPC is associated with various benefits in connection with manufacturing integrated circuits. For example, OPC can enhance process window(s), thereby providing a higher yield. Further, utilizing OPC can result in better circuit performance for a given minimum feature size, due to line-width uniformity that allows for faster clock rates. Moreover, smaller design rules can be adopted, enabling further shrinking of CDs. While OPC provides these and other benefits to integrated circuit manufacturing, it is a time consuming process and can require a substantial amount of computing resources to generate accurate simulations of mask adjustments. This is because conventional OPC requires movement of particular line edges on a mask to optimize printability, which consequently disturbs interconnected line edges and/or adjacent line edges. For instance, edges on a mask are required to be broken and moved, resulting in interaction among various other edges. Due to such movements, a final OPC correction may not be optimal.

There are various factors that can contribute to a need for OPC, as all steps utilized in integrated circuit manufacturing can cause errors during pattern transfer of the original layout design to silicon. For example, physical errors in the mask can be generated during mask manufacturing, causing the printed mask to be disparate from the ideal design. Also, as designs continue to shrink, the lithography process without OPC can result in a pattern upon the silicon that is not desirable. Resist development and etching can also be associated with errors that result in lessening fidelity between an idealized pattern and a resultant pattern upon silicon. These and other processes can cause corner rounding and lack of CD accuracy upon a pattern.

Historically, an engineer completed OPC manually (e.g., the engineer would alter line edges manually utilizing trial and error to obtain an acceptable pattern upon a wafer resulted). As CDs continue to shrink, manual OPC has become less effective. For instance, each time an edge is moved, other edges are affected. As spaces between edges decrease, this manual procedure will become nearly impossible. Thus, automation techniques have been recently developed to make up for these deficiencies. Particularly, rule based techniques and model-based techniques have been employed to automate OPC. Rule based techniques are an extension of methods utilized for manual OPC (e.g., through experimentation, corrections for a particular pattern layout are discovered). Rule based techniques are computationally fast, and can thus be applied to an entire integrated circuit layout. Model-based techniques utilize simulated models to compute wafer results and modify edges on the mask to improve such simulated results. The model-based techniques are capable of more general correction, but can require substantial amounts of time and computational resources. Accordingly, there exists a need in the art for an OPC system and/or methodology that provides optimal results in connection with pattern transfer while not requiring a substantial amount of time/computational resources.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention utilizes a novel system and/or methodology to perform optical proximity correction (OPC) upon a layout that is desirable patterned onto a silicon wafer. The subject invention provides marked improvement over conventional OPC systems and/or methodologies, as the present invention facilitates more robust and general correction as compared to rules-based OPC while only requiring a fraction of the time required to perform conventional model-based OPC. The present invention accomplishes these and other benefits by categorizing patterns within the layout as one-dimensional or two-dimensional. For example, a corner or plurality of corners proximate to one another can be categorized as two-dimensional, while straight lines/edges not proximate to a corner can be categorized as one-dimensional. The layout can then be altered based at least in part upon such categorization.

Particularly, patterns categorized as two-dimensional can be replaced/covered by blocks large enough in size to entirely cover such two-dimensional patterns. The blocks can be square, rectangular, or any other suitable shape that facilitates optimal OPC. The size, shape, and position over the two-dimensional patterns can be based upon a set of pre-defined rules. For example, proximity of other two-dimensional patterns, size of two-dimensional patterns, shape of two-dimensional patterns, etc. can be contemplated by the rules.

Upon placement of blocks over patterns categorized as two-dimensional, conventional model-based OPC techniques can be employed with respect to patterns labeled as one-dimensional. In conventional model-based OPC techniques, numerous simulations are required, as breaking edges throughout a layout causes other edges to be moved/affected. Particularly, when edges are broken near corners of a pattern/shape within a layout, various other edges are typically affected. Thus, as more edges are broken and replaced, more simulations are required, and consequently more time is required to perform OPC. The present invention only utilizes model-based OPC upon patterns categorized as one-dimensional, thus vastly reducing time and computational resources required while still generating an adequate solution.

In accordance with one aspect of the present invention, the layout can be automatically generated based upon a design created by a designer. For instance, a designer can interconnect a plurality of gates and various other circuit elements within a design tool to generate an integrated circuit design. Thereafter a software component can be employed to automatically generate a layout that is desirably patterned onto a silicon wafer. For example, a graphical rendering of a layout can be delivered to a designer. In accordance with another aspect of the present invention, a software tool can be provided that automatically categorizes patterns within the layout as one-dimensional or two-dimensional. In a disparate embodiment, a designer can designate patterns within the layout as one-dimensional or two-dimensional.

To the accomplishment of the foregoing and related ends, the invention then, comprises the features hereinafter fully described and particularly pointed out in the claims. The following description and the annexed drawings set forth in detail certain illustrative aspects of the invention. These aspects are indicative, however, of but a few of the various ways in which the principles of the invention may be employed and the present invention is intended to include all such aspects and their equivalents. Other objects, advantages and novel features of the invention will become apparent from the following detailed description of the invention when considered in conjunction with the drawings.

DETAILED DESCRIPTION OF THE INVENTION

Figure 1:
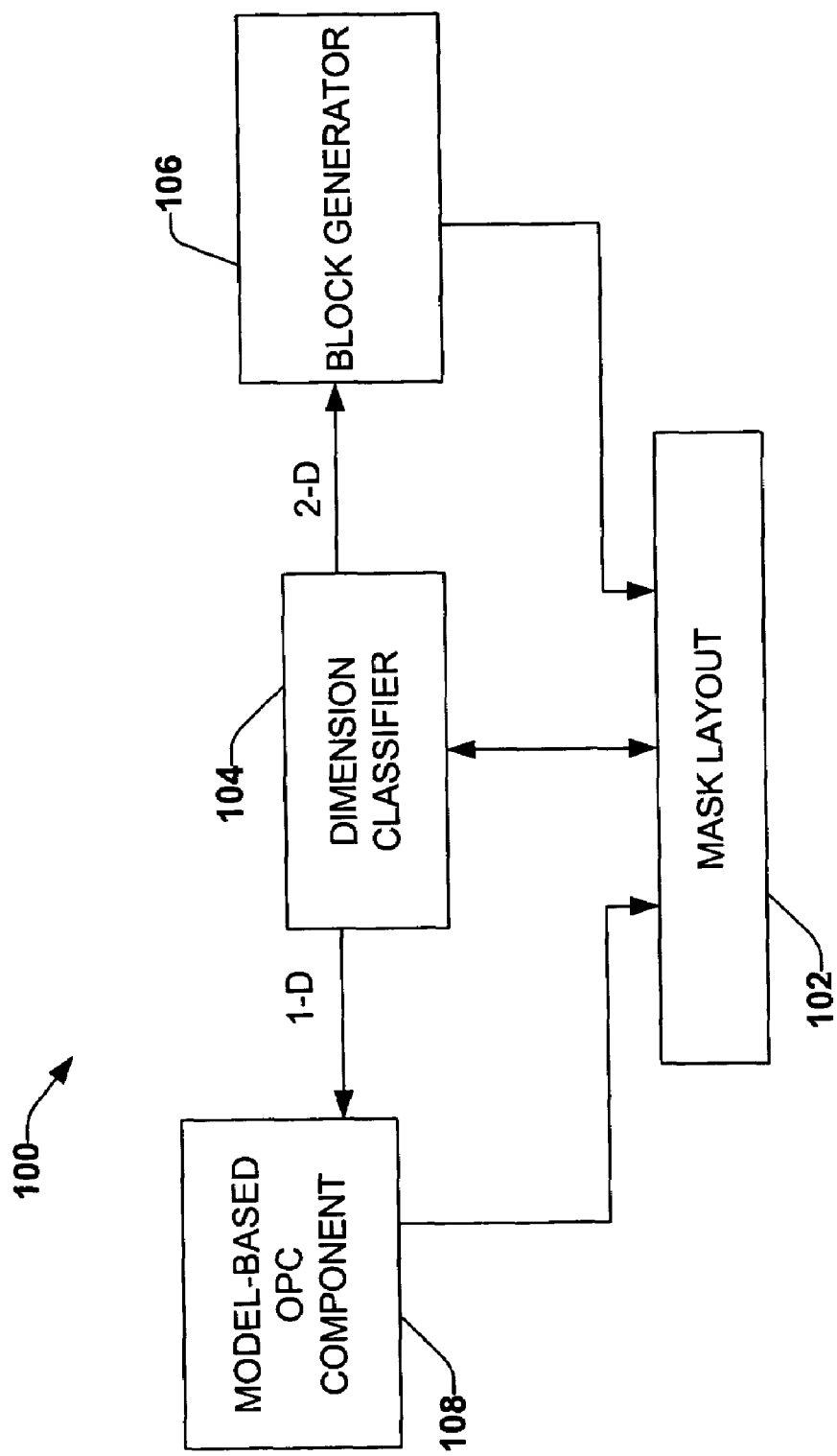
FIG. 1 is a block diagram of an optical proximity correction system in accordance with an aspect of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

As used in this application, the terms "component," "handler," "model," "system," and the like are intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers. Also, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal).

Referring now to the drawings, FIG. 1 illustrates a high-level system overview in connection with one particular aspect of the subject invention. The present invention relates to a novel system 100 for providing optical proximity correction to a design for an integrated circuit. The system 100 includes a mask layout 102 that is desirably patterned onto a silicon wafer. For example, the mask layout 102 can be data developed from an integrated circuit design. Particularly, an integrated circuit design can be generated in a software tool by a designer, and a mask layout 102 can automatically be developed therefrom. The integrated circuit design developed by the designer would not efficiently transfer to a mask, thus another tool that creates a mask layout pattern based upon the design is often necessary. In accordance with another aspect of the present invention, the mask layout 102 can be obtained from an existing physical mask. For instance, data relating to a particular mask layout may be lost and/or destroyed, while the physical mask relating to such data is useful for a particular purpose. Thus, disparate imaging tools can be employed to obtain the mask layout 102 from the physical mask.

A dimension classifier 104 thereafter differentiates between one-dimensional patterns and two-dimensional patterns upon the mask layout 102. For example, an area with a corner would be classified as two-dimensional, while a straight edge would be classified as one-dimensional. Various rules can be employed in connection with categorizing a portion of the mask layout 102 as one-dimensional or two-dimensional. For instance, a corner and a particular distance therefrom can be categorized as two-dimensional, while a particular distance upon a straight edge can be categorized as one-dimensional. It is to be understood that any categorization of a mask layout 102 into one-dimensional and two-dimensional patterns is contemplated by the present invention and intended to fall within the scope of the hereto-appended claims. These classified one and two-dimensional patterns within the mask layout 102 that are obtained by the dimension classifier 104 are thereafter utilized in connection with providing optical proximity correction (OPC) to the mask layout 102. OPC is desirable in connection with integrated circuit manufacturing, as the mask layout 102 does not transfer perfectly to a silicon wafer.

Upon classification of patterns within the mask layout 102 as one-dimensional or two-dimensional, the mask layout 102 is subject to a block generator 106. Particularly, the block generator 106 places square or rectangular blocks over patterns within the mask layout that are identified as two-dimensional patterns. The placement and/or selection of blocks can depend upon a set of pre-defined rules. For example, size of a block placed upon a two-dimensional pattern can depend upon width of a pattern, proximity of the two-dimensional pattern to a disparate pattern and/or line, or any other suitable manner to utilize in connection with determining placement and/or size and/or shape of a block. Applying blocks over patterns classified as two-dimensional by the dimensional classifier 104 is a novel and vastly different approach from what is conventionally utilized in connection with OPC. For instance, general mask layout may require alteration to allow placement of blocks over two-dimensional patterns without existence of overlap (e.g., in many layouts there is no room for such blocks). Designs of mask layouts, however, can be altered to enable placement of these blocks, and altering design for such blocks would result in higher performance circuits due to improved OPC, as well as less computational resources and time required for OPC.

After the blocks have been placed upon the mask layout 102, patterns classified as one-dimensional by the dimension classifier 104 are subject to a model-based OPC component 108. The model-based OPC component 108 utilizes simulation models to compute results of proposed OPC and modify one-dimensional patterns on the mask layout 102 based upon the computed results. Model-based OPC typically is associated with better corrections when compared to rule-based OPC, but can require a substantial amount of time due to time-intensity of simulations. Thus, rather than employing model-based OPC to the entirety of the mask layout 102 (which can require a substantial amount of time as well as computational resources) or rule-based OPC to the entirety of mask layout 102 (which is related to reduced performance), two-dimensional patterns are covered by large blocks based upon a set of rules and one-dimensional patterns are subject to OPC. Utilizing the model-based OPC component only upon one-dimensional patterns within the mask layout 102 will not require nearly the amount of time as conventional model-based OPC, as altering one-dimensional patterns connected to the blocks laid by the block generator 106 will not require a series of related alterations (e.g., alteration of one edge or line conventionally requires alteration of several connected and/or related edges and/or lines). A mask can thereafter be manufactured, wherein the mask includes the blocks placed over the two-dimensional patterns as well as modifications made by the model-based OPC component 108.

Figure 2:
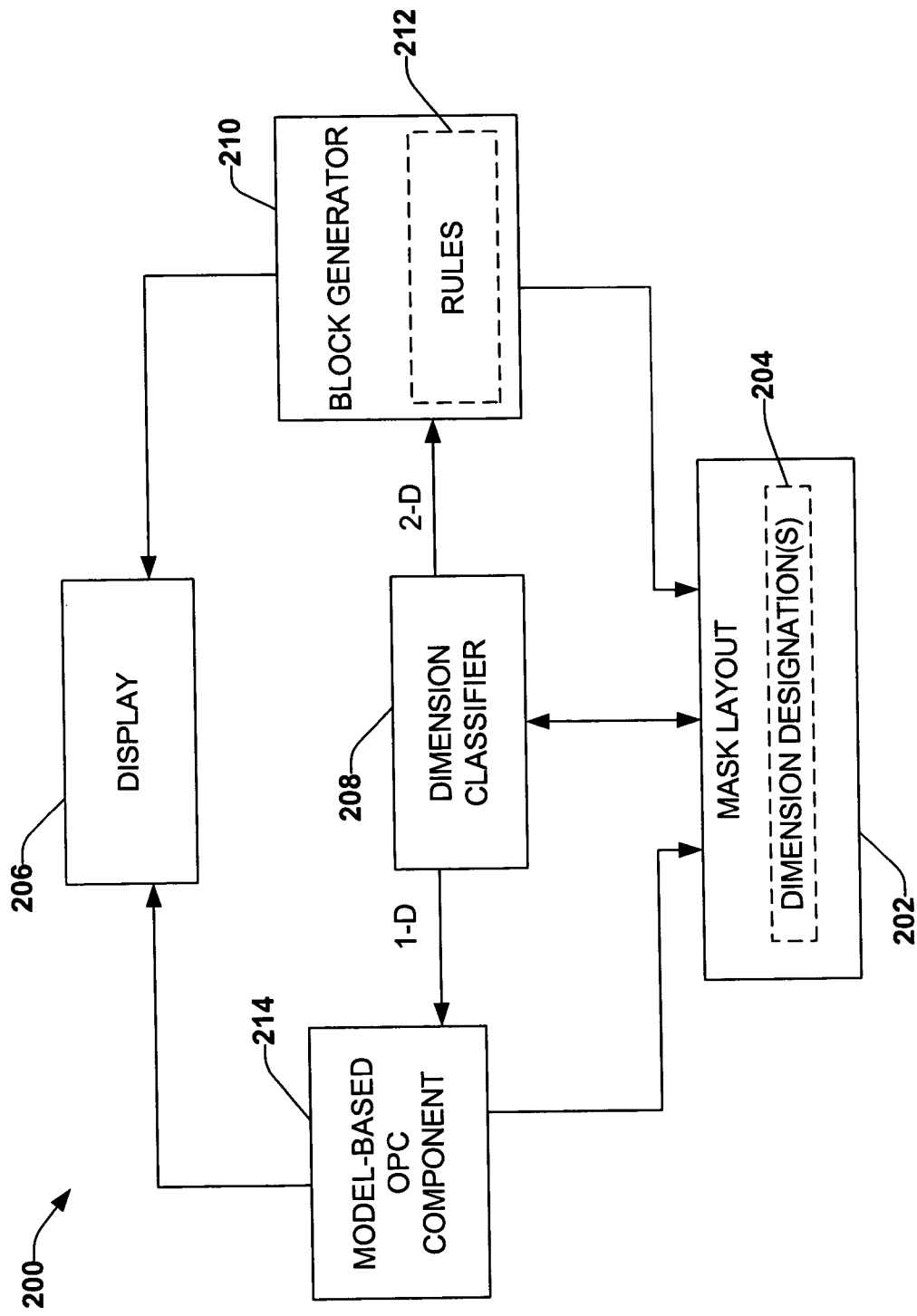
FIG. 2 is a block diagram of an optical proximity correction system in accordance with an aspect of the present invention.

Now referring to FIG. 2, a system 200 that facilitates increasing fidelity between desired patterns upon silicon and actual patterns upon silicon is illustrated. The system 200 includes a mask layout 202 that is obtained through an integrated circuit design created by a designer. For example, can design at least a portion of an integrated circuit within a design tool. The design can include a plurality of gates (e.g., AND, OR, NOR, . . . ) as well as electrical components (e.g., power supplies, grounds, resistors, . . . ). This integrated circuit design does not translate directly to a mask, and thus another tool can be employed to generate target layout data, which represents a desired pattern or series of patterns that are to be created upon a silicon wafer. Such target data makes up the mask layout 202.

The mask layout 202 also includes dimensional designations 204 upon patterns therein. Particularly, disparate patterns or portions of patterns are labeled as one-dimensional or two-dimensional. For instance, a change in direction and an area proximate thereto can be labeled as a two-dimensional pattern. Similarly, a straight edge/line or portion thereof that is not proximate to a pattern labeled as two-dimensional can be labeled as a one-dimensional pattern. One-dimensional and two-dimensional patterns can be automatically labeled as such by a software tool that transforms design data into layout data, or alternatively reviewed by a designer and labeled according to such review. For instance, a display 206 can be provided to enable a designer to view layout data and/or a graphical rendering of the mask layout 202. Thereafter, the designer can label patterns and/or portions of patterns accordingly utilizing a user interface (not shown) such as a mouse, keyboard, etc.

A dimension classifier 208 is provided to differentiate between the labeled one-dimensional and two-dimensional patterns. Upon such differentiation, a block generator 210 generates and places blocks upon the two-dimensional patterns according to a set of associated rules 212. The blocks generated by the block generator 210 can be square and/or rectangular, wherein the shape, size, and placement of the blocks are dictated by the rules 212. For instance, a different sized and/or shaped block can be placed depending on location of the two-dimensional patterns, proximity of the two-dimensional patterns to other patterns, or any other suitable rules that can be employed to determine positioning and size of the blocks. In accordance with one aspect of the present invention, a block can replace and/or be placed over each pattern labeled as a two-dimensional pattern. The mask layout 202 can thereafter be delivered to the display 206 to provide the designer with a graphical rendering of the mask layout 202 with the blocks added thereto.

After the blocks have been added to the mask layout 202, a model-based OPC component 214 can be provided to utilize model-based OPC techniques upon only patterns labeled as one-dimensional. Conventional model-based OPC techniques can be employed by the model-based OPC component 214. As all patterns labeled as two-dimensional will not be subject to the model-based OPC component 214, substantially fewer simulations will be required to complete OPC. Particularly, no model-based OPC will be utilized upon corners, which will be labeled as two-dimensional. Thus, movement of straight edges labeled as one-dimensional will not cause alteration of related edges, resulting in less time required for adequate OPC.

Figure 3:
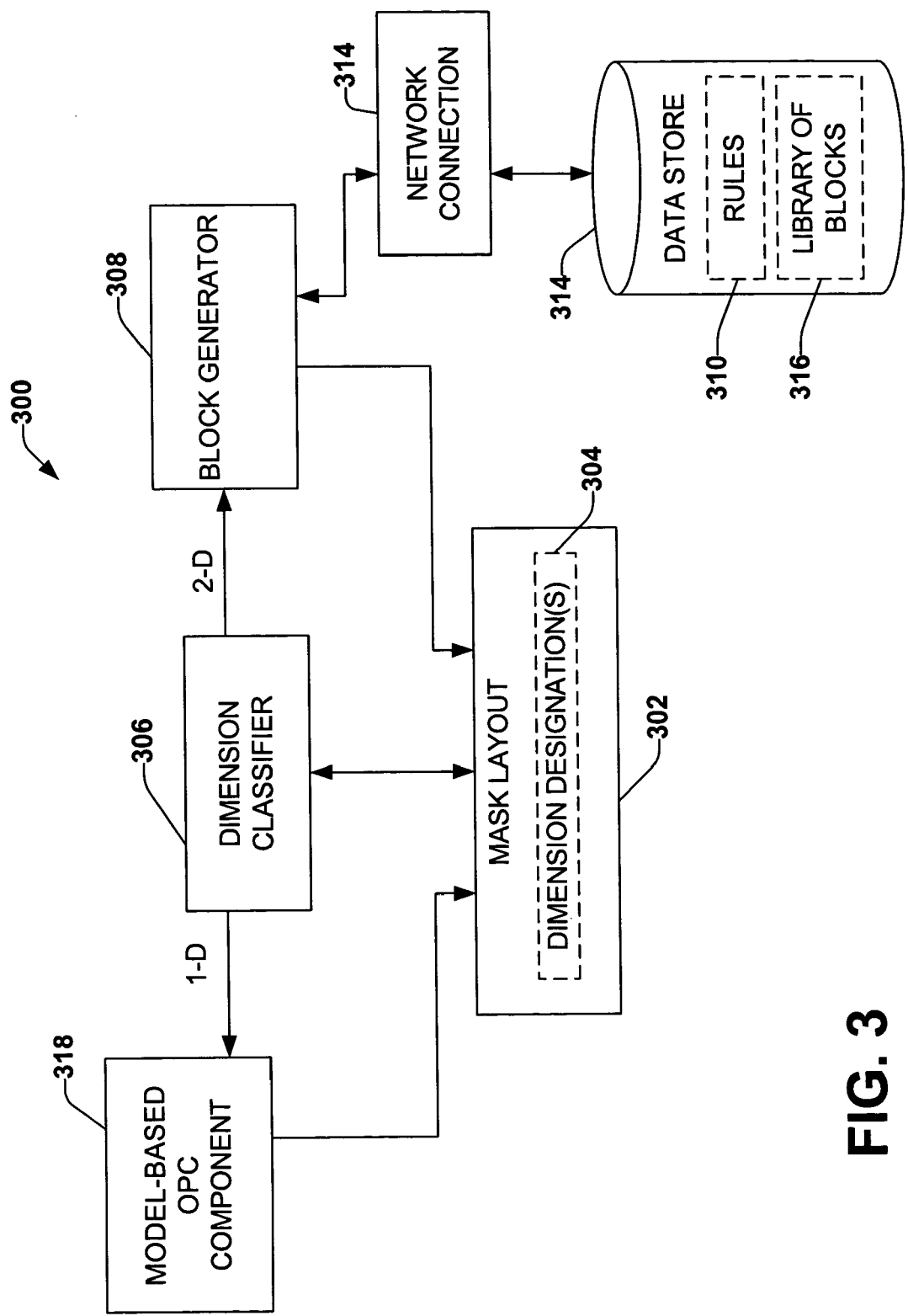
FIG. 3 is a block diagram of an optical proximity correction system in accordance with an aspect of the present invention.

Turning now to FIG. 3, a system 300 that facilitates improved OPC is illustrated. The system 300 includes a mask layout 302 with dimension designation(s) 304 related thereto. For instance, a designer or an integrated circuit design tool can add the dimension designation(s) 304 to the mask layout 302. A dimensional classifier 306 thereafter reviews the dimension designations 304, and informs a block generator 308 to replace the two-dimensional patterns with blocks. These blocks can be square and/or rectangular, and can vary in size and shape. Size, shape, and placement of blocks can be based upon a set of rules 310 located within a data store 312. The data store 312 can be a hard drive, memory, RAM, ROM, flash memory, removable media, or any other suitable data storage device. The data store 312 (and thus the rules 310) can be accessed by the block generator 308 via a network connection 314. Such network connection 314 can facilitate communications over an internal and/or external network, as well as a wireless and/or wireline connection. Thus, the network connection 314 facilitates communication between the data store 312 and the block generator 308 over any suitable network.

The data store 312 also comprises a library of blocks 316 that can be placed upon two-dimensional patterns within the mask layout 302 based at least in part upon the rules 310. This library of blocks 316 includes any suitable square and or rectilinear blocks, wherein blocks within the library of blocks 316 are associated with one or more of the rules 310. Furthermore, as the data store 312 is accessible via the network connection, blocks can be added and/or deleted from the library of blocks 316 depending upon performance. Moreover, as designs are altered, new rules and blocks associated therewith can be added to the existing rules 310 and the library of blocks 316, respectively. For example, a designer can notice that existing blocks within the library of blocks 316 and existing rules within the library of rules 310 are inapplicable to a particular two-dimensional pattern. The designer can then update the rules 310 and the library of blocks 316 to enable a desirable OPC solution. As the data store 312 is accessible over a network, the rules 310 and the library of blocks 316 that include the added rule(s) and block(s) can be accessible to any OPC system connected to the network, thereby increasing OPC efficiency in a fab.

After the block generator 308 has replaced two-dimensional patterns within the mask layout 302 with blocks, a model-based OPC component 318 utilizes conventional model-based OPC techniques to perform OPC on only the one-dimensional patterns. As corners and other two-dimensional patterns are not subject to model-based OPC, a desirable OPC solution can be found at a fraction of time required as compared to utilizing model-based OPC on an entire integrated circuit.

Figure 4:
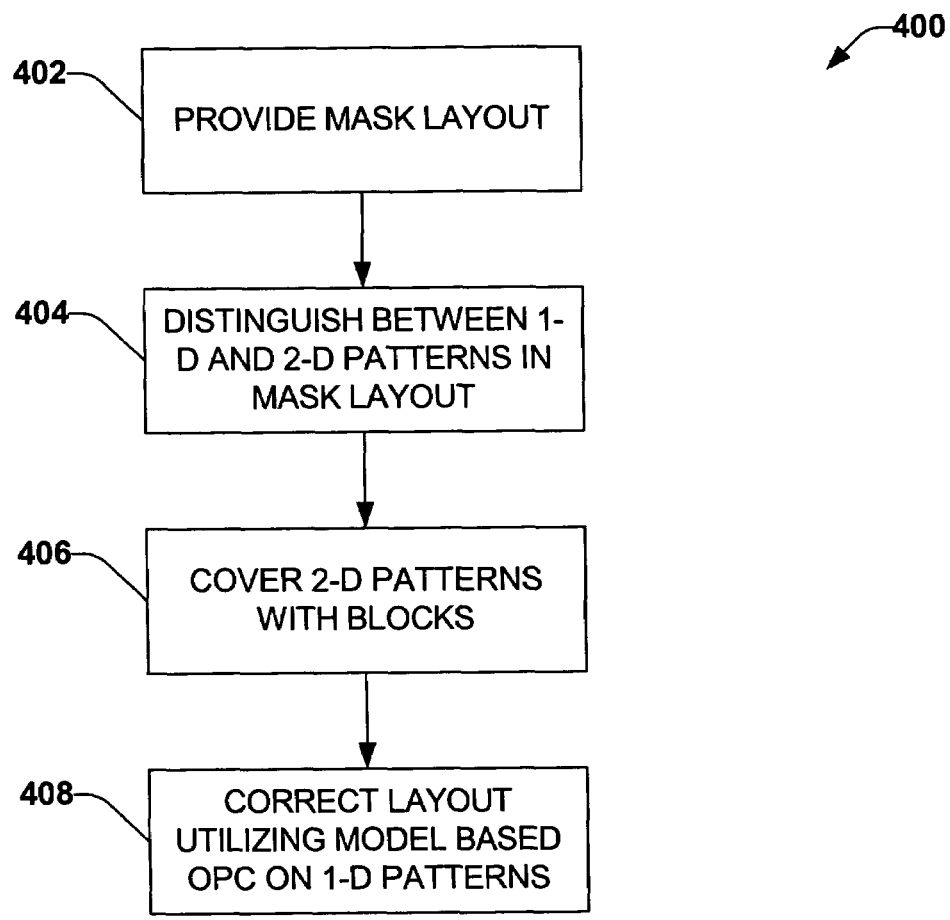
FIG. 4 is a representative flow diagram illustrating a methodology for performing optical proximity correction in accordance with an aspect of the present invention.

Referring now to FIG. 4, a methodology 400 for performing OPC by differentiating between one-dimensional and two-dimensional patterns within an integrated circuit design is illustrated. While, for purposes of simplicity of explanation, the methodology 400 is shown and described as a series of acts, it is to be understood and appreciated that the present invention is not limited by the order of acts, as some acts may, in accordance with the present invention, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the present invention.

At 402, a mask layout is provided. The mask layout can be generated from an integrated circuit design that is created by a designer in a software tool. For instance, the software tool can provide graphical renderings of various gates and other circuit components (e.g., grounds, power supplies, . . . ). The designer can create an integrated circuit by interconnecting the gates and circuit components, and such design can be relayed to a software tool that specializes in generating a mask layout based upon the design. Alternatively, an existing physical mask can be utilized in connection with obtaining a mask layout. For instance, conventional image capturing technology can be employed to obtain an image of a design layout on the mask. This is beneficial in instances that design and/or layout data related to the mask has been lost or corrupted.

At 404, a distinction is made between one-dimensional and two-dimensional patterns within the mask layout. For example, a change in direction of a line and an area proximate thereto can be categorized as a two-dimensional pattern (e.g., a corner and an area proximate thereto will be a two-dimensional pattern). Therefore, straight lines that are not proximate to corners and/or other change of direction are categorized as one-dimensional patterns. In accordance with one aspect of the present invention, a software component is employed to differentiate between one-dimensional and two-dimensional patterns based upon a set of rules. In a disparate embodiment, a designer can manually enter which patterns should be categorized as one-dimensional and/or two-dimensional.

At 406, patterns categorized as two-dimensional will be covered/replaced by blocks. Such blocks can be square and/or rectangular, and can differ in size and shape depending upon parameters related to the two-dimensional pattern (e.g., proximity to other two-dimensional patterns, size of two-dimensional pattern, . . . ). For example, a set of rules can be employed in connection with replacing two-dimensional patterns with blocks. Furthermore, a library of blocks can be employed to facilitate reduction in computation time required for placement/sizing of the blocks. For instance, rules can be associated with blocks within the library of blocks, and one or more of such blocks can be positioned upon the layout design according to the rules.

At 408, conventional model-based OPC techniques are employed upon only the one-dimensional patterns within the mask layout. This facilitates faster OPC due to reduction in simulations required. Specifically, alterations in one-dimensional patterns utilizing the present invention will not require alterations in disparate one-dimensional patterns due to the blocks that replace the two-dimensional patterns.

Figure 5:
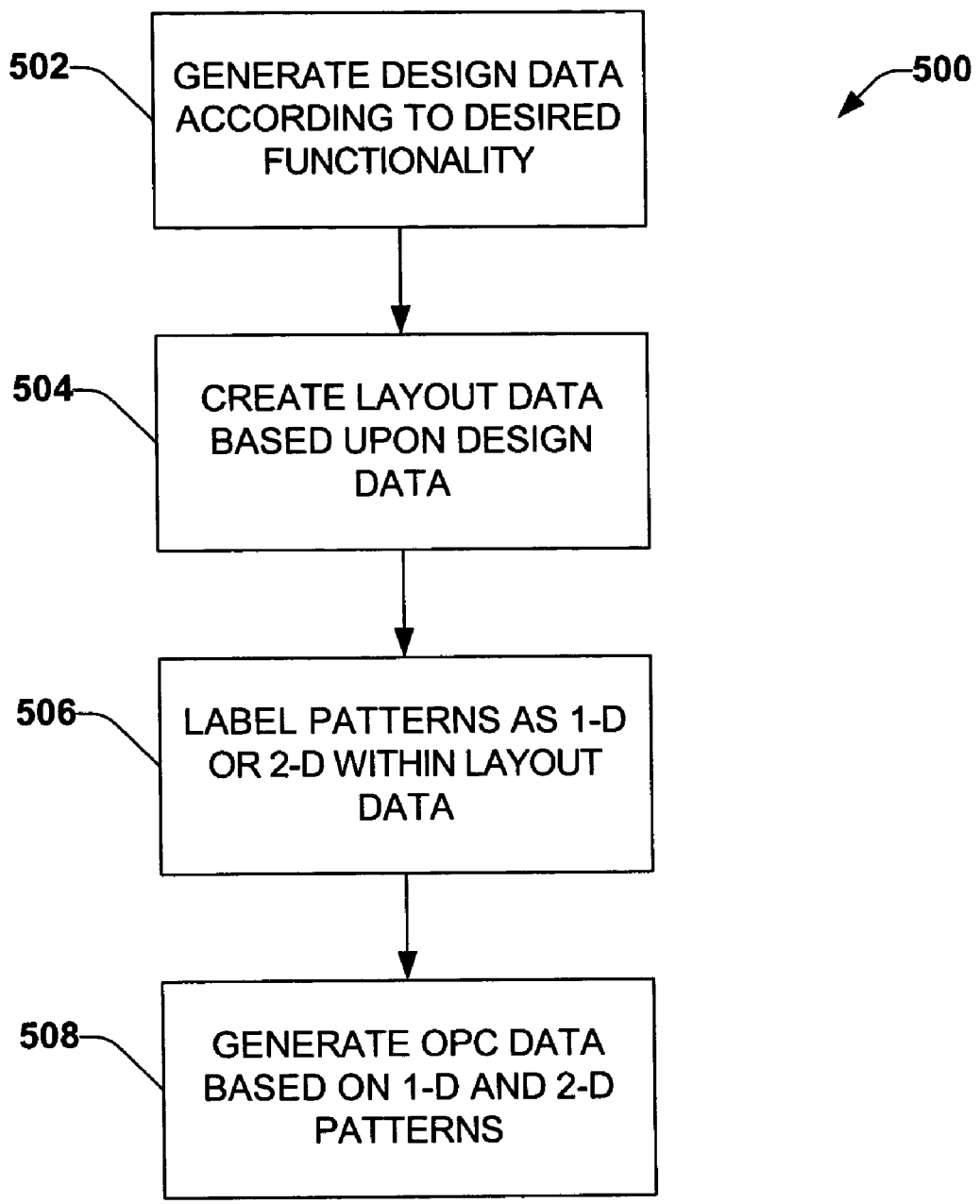
FIG. 5 is a representative flow diagram illustrating a methodology for performing optical proximity correction in accordance with an aspect of the present invention.

Referring now to FIG. 5, a methodology 500 for generating OPC data is illustrated. At 502, design data is generated according to desired integrated circuit functionality. For example, gates and/or various circuit components (e.g., resistors, grounds, capacitors, power supplies, . . . ) can be interconnected to generate an integrated circuit design in a software tool. The design can be a graphical rendering of such integrated circuit, and data at least partially enabling such graphical rendering can be stored as design data.

At 504, mask layout data can be generated from the design data. For instance, a target layout pattern that is desirable patterned onto a silicon wafer can be generated based at least in part upon the design data. In accordance with one aspect of the present invention, a software tool can be provided that automatically generates target layout data based upon the design data. At 506, patterns within the layout data are labeled as one-dimensional or two-dimensional. For example, a graphical rendering of patterns resultant from the target layout data can be generated and displayed to a designer. The designer can thereafter manually classify patterns within the graphical rendering of the target layout data as one-dimensional or two-dimensional. In accordance with a disparate aspect of the present invention, a software tool can be provided to automatically differentiate between one-dimensional patterns and two-dimensional patterns based upon a set of rules, and label such patterns accordingly. For example, a corner and a particular distance therefrom can be categorized as a two-dimensional pattern.

At 508, OPC data is generated based at least in part upon the distinction between one-dimensional and two-dimensional patterns. Particularly, blocks can be placed upon the two-dimensional patterns according to size/shape/location of such two-dimensional patterns. The blocks can be square and/or rectangular, and in accordance with one aspect of the present invention can reside within a library or blocks. Upon placing the blocks upon the two-dimensional patterns, a model-based OPC technique can be completed upon the remaining one-dimensional patterns within the target layout data. Utilizing the blocks in connection with the conventional OPC technique facilitates obtainment of desirable OPC data without requiring an amount of time and resources associated with such model-based OPC technique. This is because change in layout data (e.g., alterations in edge/line locations) can have a domino effect with respect to other related edges. Particularly, there is interaction amongst edge movements, causing a high number of simulations to obtain desirable OPC data. The present invention utilizes blocks to reduce simulations and consequently reduce time required for obtainment of adequate OPC data. Further, the patterned silicon will closely resemble the target layout upon utilization of the present invention.

Figure 6:
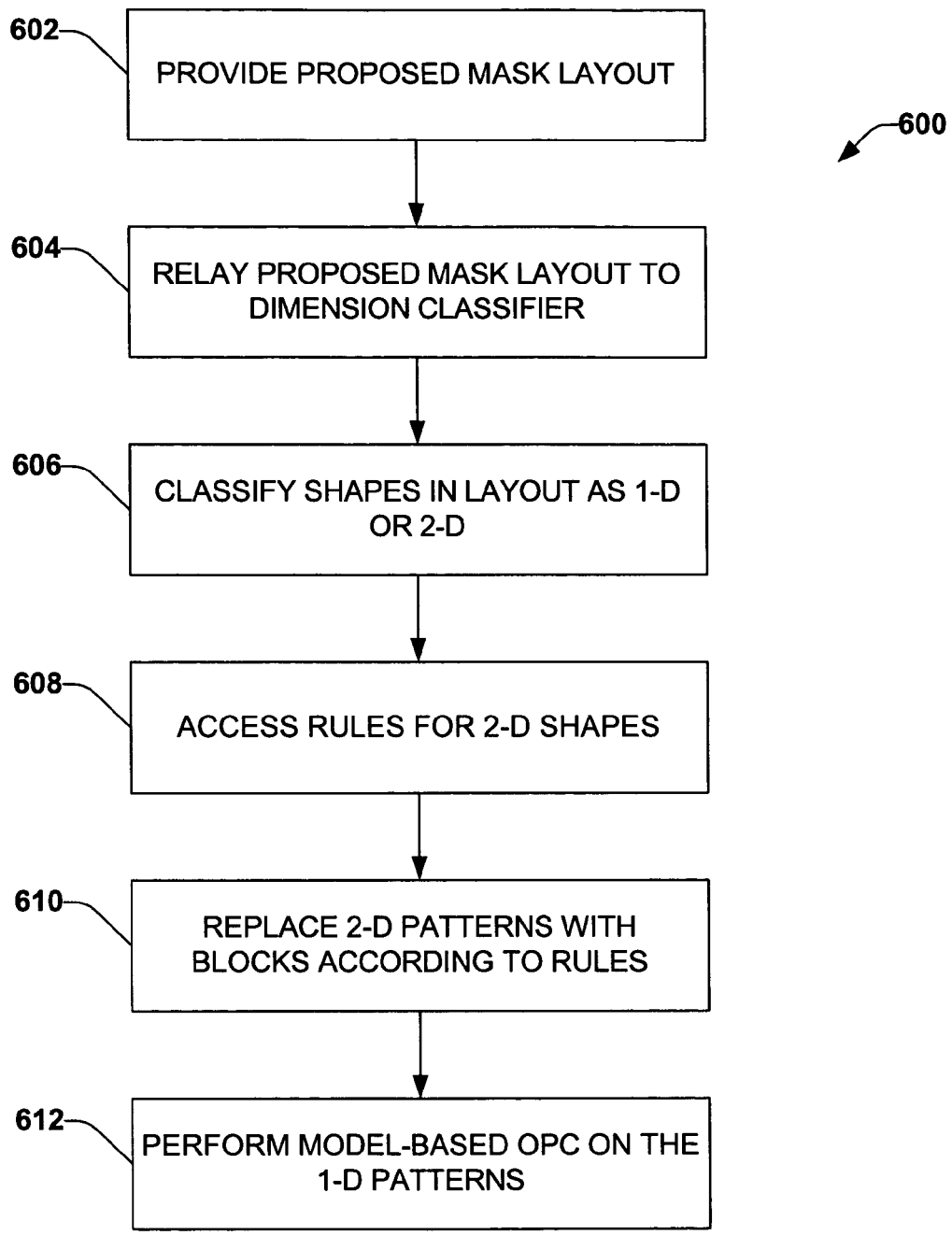
FIG. 6 is a representative flow diagram illustrating a methodology for performing optical proximity correction in accordance with an aspect of the present invention.

Now turning to FIG. 6, a methodology for generating a mask that creates patterns upon silicon that resemble a desired layout pattern is illustrated. At 602, a proposed layout for a mask is provided. This proposed mask layout can include a plurality of patterns that are desirably transferred to a silicon wafer. At 604, the proposed mask layout is relayed to a dimension classifier. At 606, the dimension classifier classifies patterns within the proposed mask layout as one-dimensional or two-dimensional. For instance, a change in line direction and an area proximate thereto can be classified as a two-dimensional pattern.

At 608, rules relating to the two-dimensional patterns classified by the dimension classifier are accessed. These rules can be located in a data store within a network, wherein the data store is accessible by numerous entities desiring to create masks from a mask layout. Further, designers can access the data store to update rules resident therein. At 610, two-dimensional patterns upon the proposed mask layout are replaced with blocks according to the rules. For example, the rules can dictate blocks of particular size and shape for a given two-dimensional pattern. At 612, model-based OPC is performed on only the one-dimensional patterns. This mitigates edge movements that occur when connected/related edges are moved. Accordingly, fewer simulations will be required thus reducing time required to generate OPC data.

Figure 7:
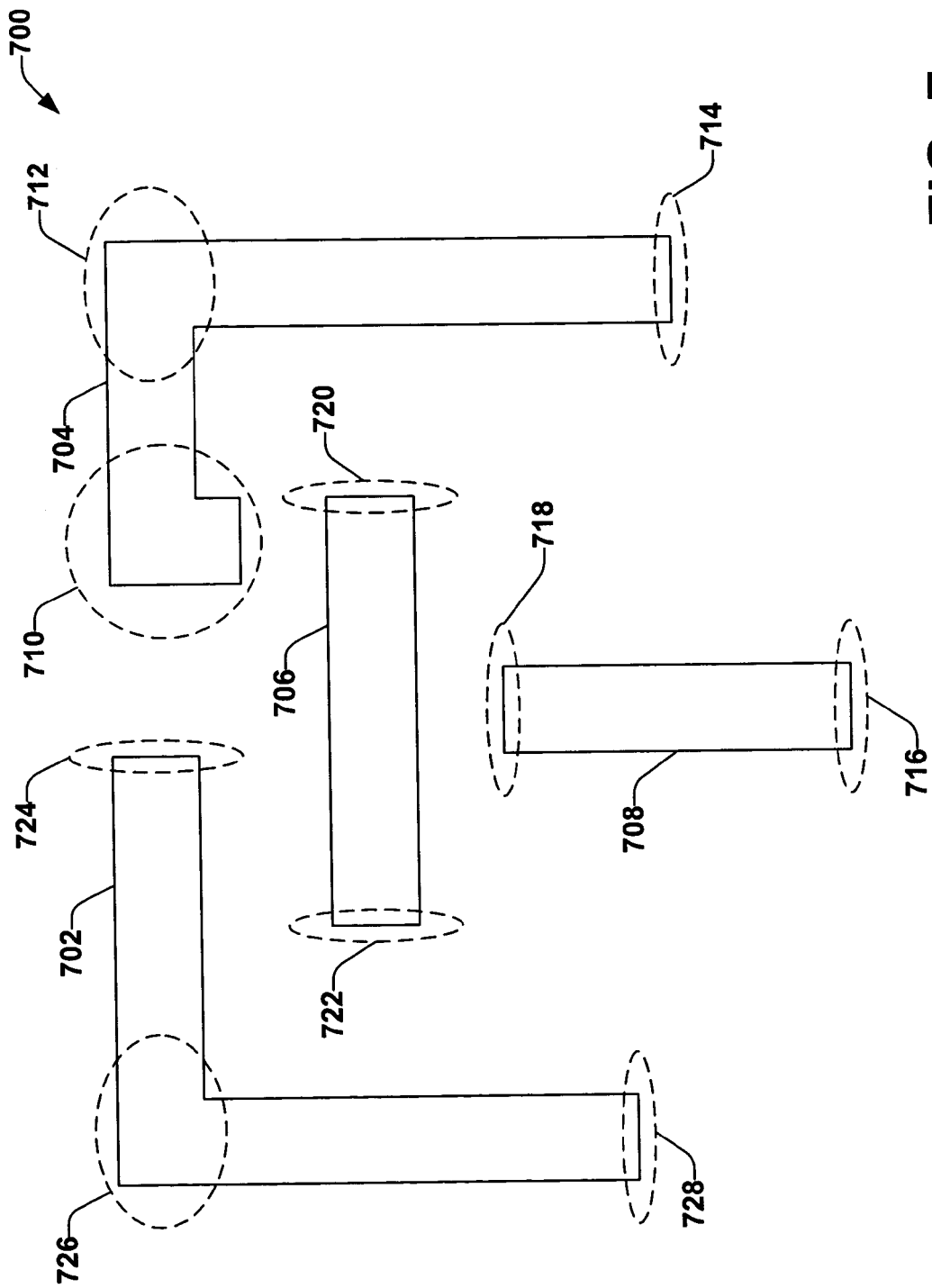
FIG. 7 is an exemplary layout that can be employed in connection with the present invention.
Figure 8:
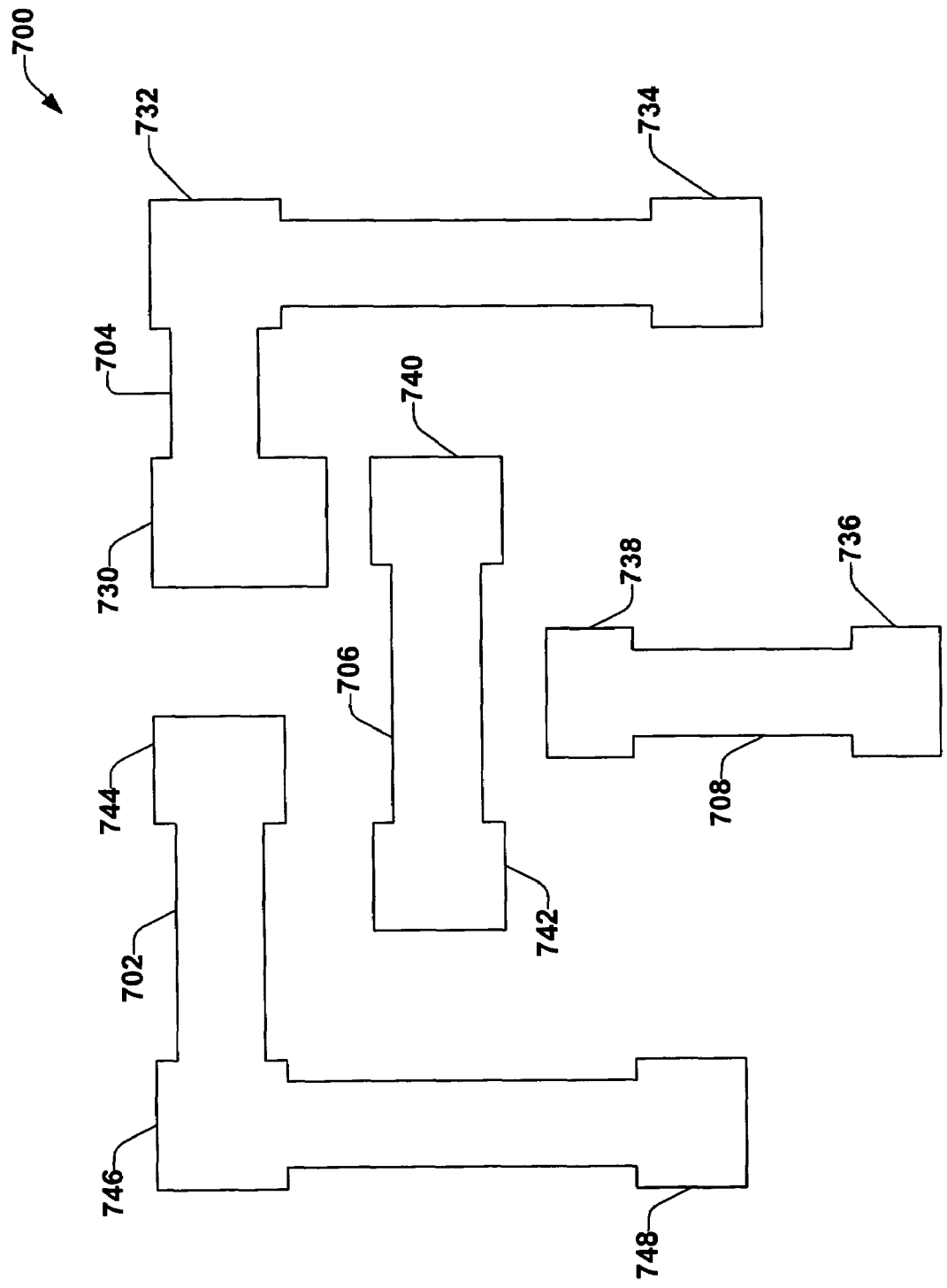
FIG. 8 illustrates blocks added to patterns designated as two-dimensional patterns in an exemplary layout in accordance with an aspect of the present invention.
Figure 9:
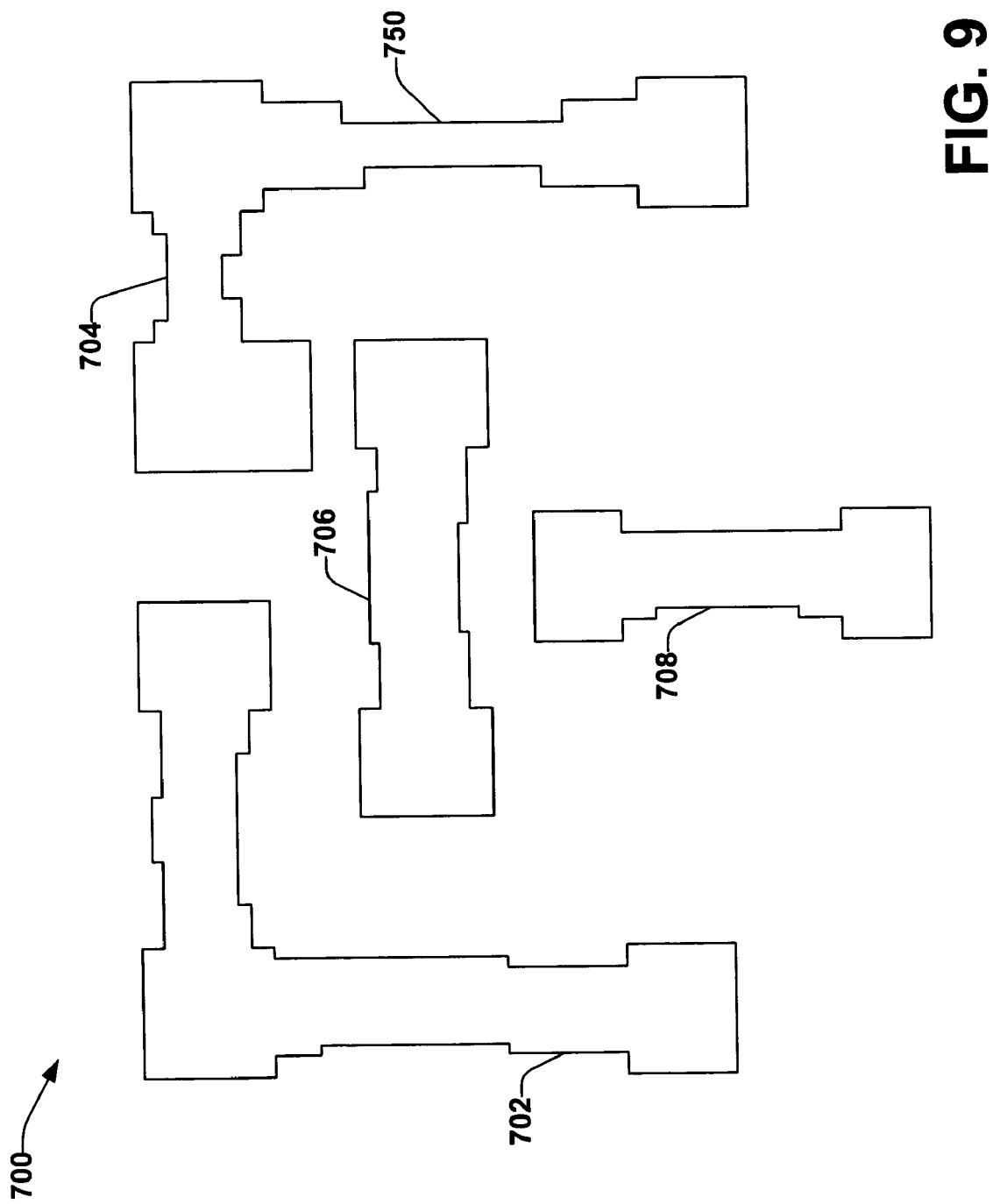
FIG. 9 illustrates an exemplary layout wherein model-based optical proximity techniques have been applied to patterns categorized as one-dimensional patterns in accordance with an aspect of the present invention.

Turning now to FIGS. 7–9, an exemplary mask layout 700 and alteration thereof when utilizing one or more aspects of the present invention is illustrated. The mask layout 700 includes shapes 702–708 that are desirably patterned onto a silicon wafer. Due to known defects that occur during lithography, however, the layout 700 will not transfer desirably to silicon. For example, corner rounding can occur outside of one or more of the shapes 702 and 704. Further, the pattern on silicon can leak outside boundaries of the shapes 702–708. Therefore, optical proximity correction upon the mask layout 700 is desirable.

The present invention identifies two-dimensional patterns that are resident upon the shapes 702–708. For example, corners are one exemplary two-dimensional pattern that can occur upon the shapes 702–708. Moreover, a group of corners and/or changes in direction within a shape can be defined as a single two-dimensional shape. For instance, two-dimensional patterns 710–728 include more than one corner, but can be grouped as a single two-dimensional pattern. Straight edges can thereafter be labeled as one-dimensional patterns. Designers can label patterns as two-dimensional or one-dimensional and/or a software tool can automatically classify patterns as one-dimensional or two-dimensional.

Now referring to FIG. 8, the mask layout 700 is shown after blocks have been added thereto. Specifically, blocks have been added to each area labeled as two-dimensional. These blocks can differ in size and shape, and placement, size, and shape thereof can be dependant upon a set of rules. For example, proximity of other two-dimensional patterns, number of corners/changes of direction within a two-dimensional pattern, and other suitable indicia can determine size, shape, and placement of the two-dimensional blocks. These rules can also correspond to information obtained over time. For instance, experimentally it can be determined that a block should be a particular size and positioned in a specific manner given a certain number of corners within an area. Thus, a rule can be based upon such experimentally obtained knowledge. With respect to the exemplary mask layout 700, blocks 730–748 have been added to the mask layout 700 corresponding to the two-dimensional patterns 710–728 (FIG. 7).

Turning now to FIG. 9, the mask layout 700 is shown after a model-based OPC technique has been applied only to the one-dimensional patterns (e.g., patterns not labeled as two-dimensional patterns). Thus, model-based OPC is not applied to any corners or changes of direction. Accordingly, fewer simulations are required to obtain a desirable OPC solution, and substantially less time is needed to obtain such solution. For one particular example, model-based OPC has been applied to line 750, thereby modifying the line 750 to enable desirable patterning on a silicon wafer. Similarly, every one-dimensional pattern upon the shapes 702–708 are subject to model-based OPC. The present invention therefore exhibits benefits over both model-based OPC and rule-based OPC systems and/or methodologies.

Figure 10:
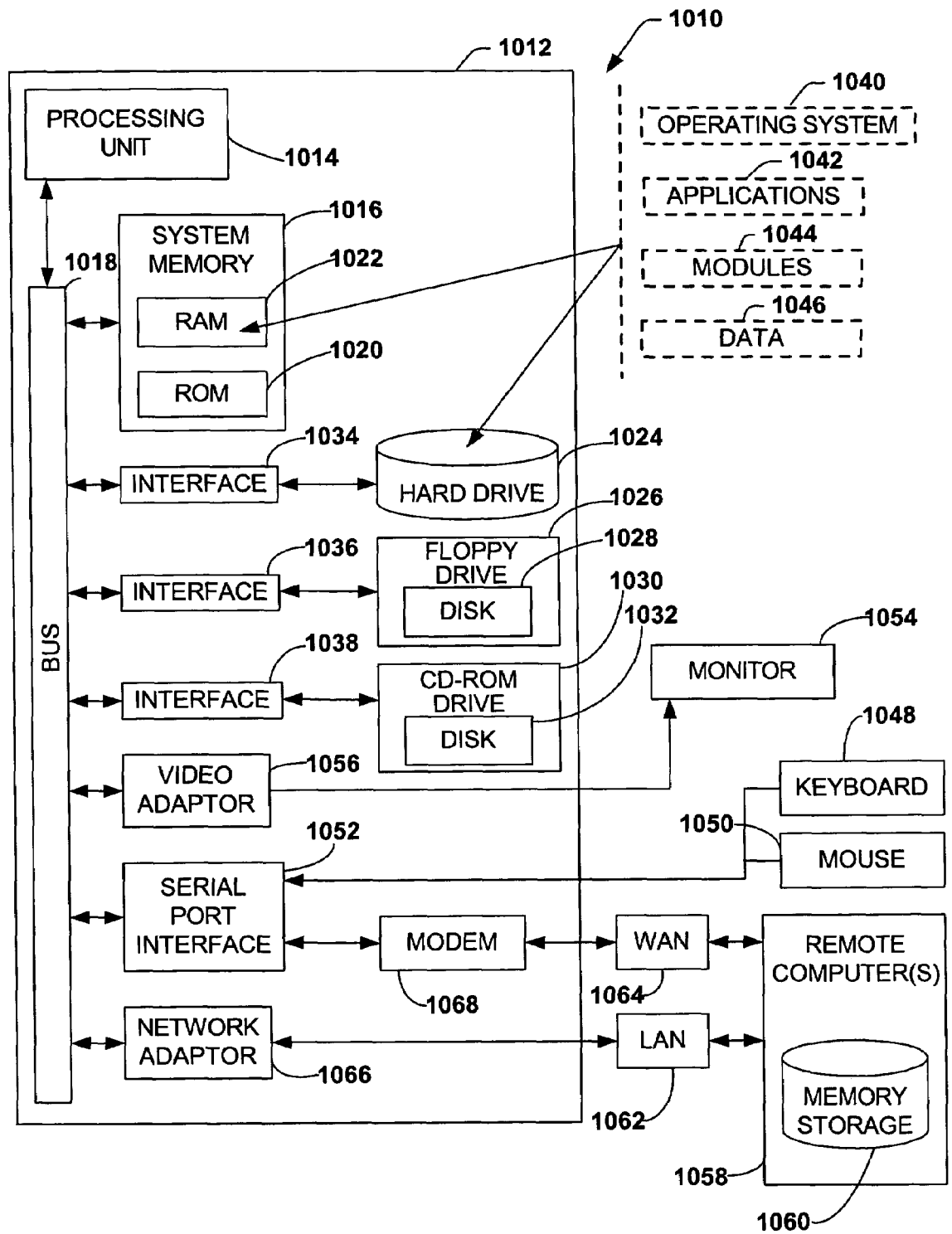
FIG. 10 is an exemplary computing environment that can be utilized in connection with the present invention.

In order to provide additional context for various aspects of the present invention, FIG. 10 and the following discussion are intended to provide a brief, general description of a suitable computing environment 1010 in which the various aspects of the present invention can be implemented. While the invention has been described above in the general context of computer-executable instructions that may run on one or more computers, those skilled in the art will recognize that the invention also may be implemented in combination with other program modules and/or as a combination of hardware and software. Generally, program modules include routines, programs, components, data structures, etc. that perform particular tasks or implement particular abstract data types. Moreover, those skilled in the art will appreciate that the inventive methods may be practiced with other computer system configurations, including single-processor or multiprocessor computer systems, minicomputers, mainframe computers, as well as personal computers, hand-held computing devices, microprocessor-based or programmable consumer electronics, and the like, each of which may be operatively coupled to one or more associated devices. The illustrated aspects of the invention may also be practiced in distributed computing environments where certain tasks are performed by remote processing devices that are linked through a communications network. In a distributed computing environment, program modules may be located in both local and remote memory storage devices.

With reference to FIG. 10, an exemplary environment 1010 for implementing various aspects of the invention includes a computer 1012, including a processing unit 1014, a system memory 1016, and a system bus 1018 that couples various system components including the system memory to the processing unit 1014. The processing unit 1014 may be any of various commercially available processors. Dual microprocessors and other multi-processor architectures also can be used as the processing unit 1014.

The system bus 1018 can be any of several types of bus structure including a memory bus or memory controller, a peripheral bus, and a local bus using any of a variety of conventional bus architectures such as PCI, VESA, Microchannel, ISA, and EISA, to name a few. The system memory 1016 includes read only memory (ROM) 1020 and random access memory (RAM) 1022. A basic input/output system (BIOS), containing the basic routines that help to transfer information between elements within the computer 1012, such as during start-up, is stored in ROM 1020.

The computer 1012 further includes a hard disk drive 1024, a magnetic disk drive 1026 to read from or write to, for example, a removable disk 1028, and an optical disk drive 1030 for reading, for example, from a CD-ROM disk 1032 or to read from or write to other optical media. The hard disk drive 1024, magnetic disk drive 1026, and optical disk drive 1030 are connected to the system bus 1018 by a hard disk drive interface 1034, a magnetic disk drive interface 1036, and an optical drive interface 1038, respectively. The drives and their associated computer-readable media provide nonvolatile storage of data, data structures, computer-executable instructions, etc. for the computer 1012, including for the storage of broadcast programming in a suitable digital format. Although the description of computer-readable media above refers to a hard disk, a removable magnetic disk and a CD, it should be appreciated by those skilled in the art that other types of media which are readable by a computer, such as magnetic cassettes, flash memory cards, digital video disks, Bernoulli cartridges, and the like, may also be used in the exemplary operating environment, and further that any such media may contain computer-executable instructions for performing the methods of the present invention.

A number of program modules may be stored in the drives and RAM 1022, including an operating system 1040, one or more application programs 1042, other program modules 1044, and program data 1046. The operating system 1040 in the illustrated computer is, for example, the "Microsoft® Windows® NT" operating system, although it is to be appreciated that the present invention may be implemented with other operating systems or combinations of operating systems, such as UNIX®, LINUX®, etc.

A user may enter commands and information into the computer 1012 through a keyboard 1048 and a pointing device, such as a mouse 1050. Other input devices (not shown) may include a microphone, an IR remote control, a joystick, a game pad, a satellite dish, a scanner, or the like. These and other input devices are often connected to the processing unit 1014 through a serial port interface 1052 that is coupled to the system bus 1018, but may be connected by other interfaces, such as a parallel port, a game port, a universal serial bus ("USB"), an IR interface, etc. A monitor 1054 or other type of display device is also connected to the system bus 1018 via an interface, such as a video adapter 1056. In addition to the monitor, a computer typically includes other peripheral output devices (not shown), such as speakers, printers etc.

The computer 1012 may operate in a networked environment using logical connections to one or more remote computers, such as a remote computer(s) 1058. The remote computer(s) 1058 may be a workstation, a server computer, a router, a personal computer, microprocessor based entertainment appliance (e.g., a WEBTV® client system), a peer device or other common network node, and typically includes many or all of the elements described relative to the computer 1012, although, for purposes of brevity, only a memory storage device 1060 is illustrated. The logical connections depicted include a local area network (LAN) 1062 and a wide area network (WAN) 1064. Such networking environments are commonplace in offices, enterprise-wide computer networks, intranets and the Internet.

When used in a LAN networking environment, the computer 1012 is connected to the local network 1062 through a network interface or adapter 1066. When used in a WAN networking environment, the computer 1012 typically includes a modem 1068, or is connected to a communications server on the LAN, or has other means for establishing communications over the WAN 1064, such as the Internet. The modem 1068, which may be internal or external, is connected to the system bus 1018 via the serial port interface 1052 to enable communications, for example, via POTS. The modem 1068 may also, in an alternative embodiment, be connected to the network adaptor 1066 to enable communications, for example, via DSL or cable. In a networked environment, program modules depicted relative to the computer 1012, or portions thereof, will be stored in the remote memory storage device 1060. It may be appreciated that the network connections shown are exemplary and other means of establishing a communications link between the computers may be used.

What has been described above includes examples of the present invention. It is, of course, not possible to describe every conceivable combination of components or methodologies for purposes of describing the present invention, but one of ordinary skill in the art may recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system that facilitates optical proximity correction, comprising:
   a layout that is desirably transferred to a silicon wafer;
   a block generator that covers with blocks selected two-dimensional patterns on the layout; and
   a model-based optical proximity correction component that alters the layout based at least in part upon a distinction between one-dimensional patterns and two-dimensional patterns within the layout by applying model-based optical proximity correction only upon the one-dimensional patterns hence saving time and computational resources.

2. The system of claim 1, the blocks being one or more of rectangular and square blocks.

3. The system of claim 1, wherein at least one of size, shape, and position of the blocks placed upon the layout is based upon a set of pre-defined rules.

4. The system of claim 3, the set of pre-defined rules are accessible over a network.

5. The system of claim 1, at least one of the blocks placed upon the layout by the block generator is obtained from a library of blocks.

6. The system of claim 5, the library of blocks accessible over a network.

7. The system of claim 1, further comprising a categorization component that categorizes a pattern within the layout as one of one-dimensional and two-dimensional.

8. The system of claim 7, the categorization component utilizes a graphical rendering of the layout to facilitate categorization of the pattern.

9. The system of claim 1, wherein a designer has labeled a pattern within the layout as one of one-dimensional and two-dimensional.

10. The system of claim 1, the layout is generated automatically based upon a design of an integrated circuit developed in a software tool.

11. The system of claim 1, a corner and an area proximate thereto within the layout constitutes a two-dimensional pattern.

12. The system of claim 1, at least a portion of a straight edge within the layout constitutes a one-dimensional pattern.

13. The system of claim 1, the altered layout printed onto a mask.

14. The system of claim 13, the mask employed in a lithography process.

15. A method for generating optical proximity correction data, comprising:
   receiving layout data, the layout data represents a layout that is desirably transferred to a silicon wafer;
   differentiating between one-dimensional patterns and two-dimensional patterns within the layout;
   covering patterns classified as two-dimensional with blocks; and
   generating the optical proximity correction data only for patterns classified as one-dimensional thereby saving time and computational resources.

16. The method of claim 15, further comprising:
   generating an integrated circuit design based upon a desired functionality; and
   automatically creating the layout data based at least in part upon the integrated circuit design.

17. The method of claim 15, further comprising utilizing a model-based optical proximity correction technique upon patterns within the layout not covered by the blocks to at least partially generate the optical proximity correction data.

18. The method of claim 15, further comprising selecting one or more of size, shape, and placement of a block that covers a two-dimensional pattern based upon one or more pre-defined rules.

19. The method of claim 15, further comprising generating a mask based at least in part upon the generated optical proximity data.

20. The method of claim 15, the layout obtained from an imaging of a mask.

21. A system that facilitates performing optical proximity correction upon a mask layout, comprising:
   means for categorizing a plurality of patterns within the mask layout as two-dimensional;
   means for replacing the patterns categorized as two-dimensional patterns with blocks; and
   means for applying a model-based optical proximity correction technique upon at least a pattern not categorized as two-dimensional hence saving time and computational resources.

22. The system of claim 21, further comprising means for selecting one or more of size, shape, and position of at least one of the blocks.

23. The system of claim 21, further comprising means for creating a mask based at least in part upon the performed optical proximity correction.

24. An optical proximity correction system, comprising:
   a layout that comprises a plurality of shapes, the layout desirably patterned onto a silicon wafer;
   a component that automatically categorizes a portion of a shape within the layout as two-dimensional;
   a block generator that replaces the portion of the shape categorized as two-dimensional with a block; and
   a model-based optical proximity correction component that performs model-based optical proximity correction upon a remainder of the shape hence saving time and computational resources.

* * * * *